United States Patent
Boukari (10) Patent No.: US 11,139,885 B2
(45) Date of Patent: Oct. 5, 2021

(54) NETWORK CREATION PROCESS FOR INTERNET SUPPLY TO THE EARTH'S COMPLETE LAND SURFACE, THE PAYLOAD AND AIRCRAFT ENABLING IT'S IMPLEMENTATION

(71) Applicants: PRODOSE, Bessieres (FR); Morou Boukari, Toulouse (FR)

(72) Inventor: Morou Boukari, Toulouse (FR)

(73) Assignee: PRODOSE, Bessieres (FR)

( * ) Notice: Subject to any disclaimer, the term of this patent is extended or adjusted under 35 U.S.C. 154(b) by 0 days.

(21) Appl. No.: 16/634,488

(22) PCT Filed: Jul. 26, 2018

(86) PCT No.: PCT/FR2018/051930
§ 371 (c)(1),
(2) Date: Jan. 27, 2020

(87) PCT Pub. No.: WO2019/020956
PCT Pub. Date: Jan. 31, 2019

(65) Prior Publication Data
US 2020/0235804 A1  Jul. 23, 2020

Related U.S. Application Data

(60) Provisional application No. 62/537,559, filed on Jul. 27, 2017.

(30) Foreign Application Priority Data

Jul. 27, 2017  (FR) ...................................... 1757121

(51) Int. Cl.
| H04B 7/185 | (2006.01) |
| H01Q 17/00 | (2006.01) |
| H05K 9/00 | (2006.01) |
| H04W 4/42 | (2018.01) |

(Continued)

(52) U.S. Cl.
CPC ........... *H04B 7/18504* (2013.01); *H01Q 1/28* (2013.01); *H01Q 17/008* (2013.01);
(Continued)

(58) Field of Classification Search
CPC . H04B 7/18504; H04B 7/18508; H04W 4/42; H04W 52/28; H04W 84/06;
(Continued)

(56) References Cited

U.S. PATENT DOCUMENTS 6,285,878 B1 * 9/2001 Lai ........................ H04W 84/02
455/431
2005/0108374 A1 * 5/2005 Pierzga .............. H04B 7/18504
709/223

(Continued)

OTHER PUBLICATIONS

International Search Report dated Nov. 22, 2018 for PCT/FR2018/051930.

*Primary Examiner* — Joseph E Dean, Jr.
(74) *Attorney, Agent, or Firm* — Maxwell L. Minch; Maxwell L Minch Esq. PA (57) ABSTRACT

The invention concerns a network creation process for the provision of internet and/or television type data signals across the complete land surface,
Linking through a digital wireless link at least one aircraft (300) with the earth station (200) on one hand, and on the other hand, with at least one means of emission and receipt, whether fixed or borne by at least one user (400), moving to an altitude lower than or equal to ten kilometers above the global land surface, and
being equipped with one or several payloads powered by the energy of the aircraft (300) in such a way as to use emission and receipt relays for the provision of at least one type of signal on the global land surface. The said process is remarkable in that the power of signals (radiation) emitted
(Continued)

by the payload is modulated to vary according to the altitude of the aircraft (300) and can thus vary from 0% on earth to 100% during cruising.

The invention also concerns the payload and the aircraft that enable implementing the said process.

29 Claims, 7 Drawing Sheets

(51) Int. Cl.
*H01Q 1/28* (2006.01)
*H04W 52/28* (2009.01)
*H04W 84/06* (2009.01)

(52) U.S. Cl.
CPC .......... *H04B 7/18508* (2013.01); *H04W 4/42* (2018.02); *H04W 52/28* (2013.01); *H04W 84/06* (2013.01); *H05K 9/0088* (2013.01); *H05K 9/0092* (2013.01)

(58) Field of Classification Search
CPC ..... H04W 52/283; H01Q 1/28; H01Q 17/008; H05K 9/0088; H05K 9/0092
See application file for complete search history.

(56) References Cited

U.S. PATENT DOCUMENTS

| | | | |
|---|---|---|---|
| 2006/0060690 A1* | 3/2006 | Aisenbrey | ................ C08J 5/041 244/1 R |
| 2010/0311460 A1* | 12/2010 | Hofmann | ........... H04B 7/18506 455/522 |
| 2014/0333491 A1 | 11/2014 | Behroozi et al. | |
| 2016/0046387 A1* | 2/2016 | Frolov | ..................... B64B 1/00 244/59 |
| 2018/0016981 A1* | 1/2018 | Herrera | ............. B29D 99/0089 |

* cited by examiner

NETWORK CREATION PROCESS FOR INTERNET SUPPLY TO THE EARTH'S COMPLETE LAND SURFACE, THE PAYLOAD AND AIRCRAFT ENABLING IT'S IMPLEMENTATION

THE INVENTION'S DOMAIN OF APPLICATION

This invention relates to the domain of internet type network implementation and particularly customizations that enable offering this service across the complete land surface in the best conditions.

DESCRIPTION OF THE PREVIOUS SCIENCE

In France, televised signals are broadcast digitally under the DVB (Digital Video Broadcasting) standard that defines the transmission method for televised services (for e.g., video signal, audio signal and data like teletext). This standard is customized and specified for each broadcast method.

There are several digital wireless link solutions that use digital data signals to provide internet to the complete land surface through wireless communication.

For example, there are constellations and programs for constellations of artificial satellites to provide internet to the global land surface and for air-earth/earth-air transmission of digital data.

These satellites are classically equipped:
With a platform that ensures the function of electric power supply, propulsion and maintaining altitude to the satellite.
With a payload including one or several repeaters made up of the following elements:
One or multiple earth-air data receipt antennas originating from one or several earth stations,
One or several amplification and polarization modules for signals received from the earth,
One or several air-earth emission antennae for amplified signals to the earth.

These artificial satellites however pose several disadvantages, that are described hereafter.

They generate a lot of debris in space around the Earth (currently over twenty thousand pieces of debris) and of the five thousand satellites launched since 1957, only one thousand four hundred are operational in 2016, those remaining are non-operational and clutter up-space.

They also have limited power. In fact, currently, the maximum power of the largest satellite is twenty-two kilowatts.

They are dedicated to their single function.
Their production and launch costs are very high.
It is not possible to repair them or change defective parts once they have been launched into space and are revolving in their orbit. They rotate at a fixed height and orbit around the Earth.

The payload has very restricted weight considering the technical constraints of launch devices and launch costs (currently, the maximum weight is eight tons with a payload under five tons). So, for example, the current maximum number of repeaters for the largest satellite is under seventy.

The air-earth data transmission flow is weak.
To avoid loss of signal upon Earth and considering the fact that these satellites rotate at over one hundred kilometers around the Earth, the opening angle of air-earth emission antennae is very small (under ninety degrees), The protection of payloads and satellite platforms requires the use of noble metals, considering the highly aggressive environment in which these satellites evolve.

There are also air-Earth internet provision projects using helium-filled balloons or pilotless solar planes flying in the stratosphere (between fourteen and twenty kilometers), but these projects have many of the disadvantages that satellite constellations have, for example:
Lower but not negligible cost,
A dedicated function,
A restricted coverage area (under one hundred kilometers on the Earth) and very low emission power (under one kilowatt).

The document U.S. Pat. No. 6,285,878 describes a new use for commercial aircraft fleets (already existing) to replace the low Earth orbit (LEO) communication satellites. This document describes a wireless broadband communication infrastructure that is low-cost, point-to-point, created by using and modifying small equipment with low power microwaves, light and low-cost, that exists aboard commercial aircraft. Each equipped aircraft has a wireless broadband link (inside their range) to one or multiple neighboring aircraft or earth stations and constitutes a continuous chain of airborne repeaters that provide wireless broadband communication gateways across the complete route. The wireless broadband communication services are also provided to clients on board a flight as well as to clients outside, throughout the flight trajectory of the commercial aircraft.

Such a system offers an alternative communication solution to satellite networks, but also has disadvantages, including the following:
It does not moderate communication power based on aircraft altitude,
It does not handle communication during take-off and up to cruising altitude, nor during the descent phase up to landing,
It does not resolve technical problems related to the generation of waves around passengers or users.

DESCRIPTION OF THE INVENTION

Starting from this point, the searchers conducted research targeted at offering an alternative to the deployment of satellites or additional aircraft dedicated to the creation of a wireless data network for internet and/or television.

The research culminated with the design and creation of a network creation process for the provision of internet and/or television type digital data signals across the complete land surface,
in which the surface receives
at least one earth station for emission and receipt of internet and/or television type digital data signals.

The said process links, through a wireless link, at least one aircraft with the earth station for emission and receipt of internet and/or television type data signals on one hand and on the other hand with at least one emission and receipt method for signals of internet and/or television type that are individual or collective, fixed or borne by at least one user, The said aircraft will move to an altitude less than or equal to ten kilometers above the global land surface, And being equipped with one or several payloads (as defined in the description of the previous science) in such a way as to use emission and receipt relays for the provision of at least one type of signal on the global land surface.

According to the invention, the process is remarkable in that the power of signals (radiation) emitted by the payload is modulated to vary according to the altitude of the aircraft and can vary from 0% on earth to 100% during cruising.

The aircraft can be a plane, drone, balloon, etc. for which the cruising does not exceed 10 kilometers in altitude.

This characteristic is particularly beneficial in that:

The process changes communication power based on aircraft altitude,

It handles communication during take-off and up to cruising altitude, and during the descent phase up to landing, It resolves technical problems related to the generation of waves around passengers or users.

The invention enables getting a network made up of a constellation of aircraft, each representing an emission and receipt module that communicates with emission and receipt earth stations.

It resolves several new technical difficulties not specified in the current networks.

In fact, such a process, by offering modulation in the power emission based on altitude, is not disadvantageous with regards to signal emission and receipt on earth, considering that the flight altitude of aircraft is not fixed and that this altitude varies for a same plane between zero kilometer (on the earth) and ten kilometers (while cruising).

The altitude is constantly measured on an aircraft and therefore acts as data already available for implementing the process that leads to power variation based on this altitude.

This modulation helps in protecting animals and humans against the radiation received from earth and originating from the payload on the aircraft, considering the very low flight altitude of aircraft (under ten kilometers) and considering the large emission power of payload antennae.

Based on a preferred, but non-restrictive application, the invention consists of making passenger transport aircraft carry the functional equivalent of the payload until now borne by satellites. These aircraft have a bay and therefore the power required to transport such an additional payload, the said aircraft transports passengers and/or freight of over five hundred kilograms, the said aircraft transports at least one person. —The payload(s) are powered by the aircraft's energy. Which is to say that when, for example, the payload(s) use electrical power, they are powered by the electrical power of the aircraft, or that they use the same fuel as the aircraft for their engines or actuators.

The operation of passenger aircraft to provide a communication network has multiple advantages.

There are currently tens of thousands of civil passenger transport aircrafts that perform hundreds of thousands of flights every day, covering almost the complete global land surface in the space located between zero and ten kilometers of altitude.

By equipping all these aircraft with payloads of the type as specified above, that equip artificial satellites with technical adaptations (modifications), the aim of the invention is to build a constellation of aircraft that will provide both passenger transport and air-earth/earth-air provision of internet connections across the complete global land surface at least cost (cost reduction by a factor of hundred to thousand) with respect to artificial satellites. Such a network can substitute or add on to the already existing networks.

The invention thus enables providing internet connections across the complete global land surface by using current and future passenger transport aircraft and by equipping these aircraft with payloads of the type used in artificial satellites, based on technical adaptations (modifications).

Of course, at present, there are passenger transport aircraft equipped to provide internet to the passengers (up to five hundred passengers) by receiving signals from an earth station or a satellite. However, these types of aircraft are not equipped to provide internet on earth like the invention proposes.

The aircraft are also equipped with methods indispensable to their navigation (anti-collision, alert, maintenance). These are methods to receive earth-air signals, methods for emission of air-earth signals and methods for air-air signals. These navigation methods are not adapted and are not meant to provide internet (air-earth) to the global land surface. However, these methods will enable tracking aircraft by earth stations for emission and receipt that make up the network.

The invention enables planning a new economic method by offering a new source of profitability upon operation of current and future civil aircraft.

By operating aircraft meant for passenger and/or freight transport, the invention avoids traffic congestion and pollution in the sky and space through debris of satellites and satellites at the end of their operational life.

Based on a factor from hundred to over a thousand, the invention enables reducing production costs, operation of payloads of satellites and air-earth and earth-air transmission systems for digital data. For example, it is no longer necessary to use noble metals to protect payloads in air-earth transmission devices for digital data.

The invention thus promotes internet access at lowest cost to the entire global population.

The functional equivalent of the payload will directly use electric power from the aircraft or its fuel. It is not necessary to have a platform for this like for a satellite. The aircraft payload can thus provide over 500 kilowatts.

Additionally, aircraft operation provides the possibility to repair the payload and change defective parts once the aircraft touches down. Aircraft can transport a payload that can attain from fifty to one hundred tons equipped with several emission and receipt antennae. Moreover, the number of repeaters is much less restricted and can go up to several thousands for each aircraft.

The air-earth/earth-air digital data transmission flow is thus increased. The increase is also due to the fact that the aircraft that transport the payloads do not go over ten kilometers which is to be compared with satellite orbits (over a hundred kilometers). The opening angle of antennae can be increased to go up to hundred and eighty degrees.

In addition, the transmission is functional and even customized in the climb after take-off and descent before landing phases, as opposed to what the previous science offered.

The invention also concerns the device, i.e. the payload that enables implementing such a process.

According to another particularly advantageous characteristic of the invention, the said payload includes one or several emission antennae for digital data signals to the global land surface.

Another especially beneficial characteristic of the invention is the antenna with a huge opening angle that reaches 180 degrees, enabling it to cover a very large transmission to the earth surface that can reach seven hundred thousand square kilometers.

One more beneficial characteristic of the invention is that the opening angle is variable based on the altitude, through an opening angle variation method that the antenna is equipped with.

Another additional feature of the invention providing significant benefit is the variation method for the opening angle, that is linked to altitude measuring sensors provided in the aircraft and/or payload.

Another important advantageous characteristic of the invention is that the opening angle variation takes place in the upward direction when the altitude is decreasing, so as to enable the antenna to have the same radiated earth surface irrespective of the aircraft's altitude.

According to another especially beneficial characteristic of the invention, the maximum opening angle is 180 degrees.

According to another especially beneficial characteristic of the invention, the maximum value of the opening angle is between 90 and 180 degrees.

Another important advantageous characteristic of the invention is that the antenna consists of a power unit for general power supply to the antenna from zero percent (on earth) to hundred percent (maximum altitude) of the maximum supply power (power at maximum altitude), in such a way that each point of the earth surface covered by the antenna receives the same power of radiation, irrespective of the altitude of the aircraft and so as to switch off the radiation from the antenna once the aircraft touches down.

According to another particularly beneficial characteristic of the invention, the antenna consists of several concentric cells, each one equipped with an individual power unit that enables customizing the power supply of each cell based on the position of each cell with respect to the central cell, such that the value of the individual power supply of each cell increases from the central cell to the peripheral cells so as to get the same radiation power received on earth irrespective of the position of the digital signal receipt point on the covered land surface.

The invention thus enables offering an efficient communication network despite the altitude variations of various aircraft that constitute it.

Another characteristic of the invention is that the maximum power supply to the payload reaches 500 Kilowatts.

One more characteristic of the invention is that the maximum power supply to the payload is between 2 and 500 Kilowatts.

One more characteristic of the invention is that the maximum power supply to the payload is between 23 and 500 Kilowatts.

One more characteristic of the invention is that the maximum power supply to the payload is between 30 and 500 Kilowatts.

The invention also concerns the passenger and/or freight transport aircraft that enables implementing the said process.

The aircraft is remarkable in that it transports passengers and/or freight of over five hundred kilograms and is equipped with at least one payload powered by the power of the aircraft meant for the transmission and receipt of signals, and several additional antennae other than the ones required for the navigation of an aircraft and implemented according to at least one of the following technologies:

Antennae painted or printed on the fuselage and/or the wings of the aircraft and/or vertical fins,
"Patch" type planar antennae that cover all or part of the fuselage, and/or wings, and/or vertical fins of the aircraft.

To protect the passengers and team members from the strong radiation emitted by the payload, thanks to a particularly beneficial feature, at least one coat of paint that absorbs the electromagnetic radiation emitted by the signals is applied to the outer surface of the aircraft. Paints having these absorbent features exist in the market, but using them to protect the passengers of an aircraft transporting the source of emission is novel.

According to a particularly advantageous feature, this layer of absorbent paint is one of the first applied.

It ensures its function of protection while authorizing the use of antennae on the external layers. It protects the aircraft interiors against radiation emitted from other aircraft.

According to another particularly beneficial feature of the invention that also aids in the protection, acoustic and thermal insulation materials that absorb electromagnetic radiation are applied to the internal surface of the aircraft. Paints having these absorbent features exist in the market, but using them to protect the passengers of an aircraft transporting the source of emission is novel.

According to another specifically advantageous feature of the invention, the aircraft's internal casing panels are made of materials that absorb electromagnetic radiation.

According to another specifically advantageous feature of the invention, the windows are made of materials that absorb electromagnetic radiation.

According to another particularly advantageous feature of the invention, the said aircraft transports from two to one thousand passengers.

According to another particularly advantageous feature of the invention, the said aircraft transports from fifty to one thousand passengers.

The absorption of electromagnetic radiation also prevents interference with the aircraft equipment. So when the aircraft is a plane, another particularly beneficial feature of the invention that is used in this function is that the emission frequencies of payloads transported by the aircraft are different, i.e. they are not the same as those of navigation equipment.

According to another particularly advantageous feature of the invention where the process interconnects several aircraft through a wireless digital link, the process consists in making them communicate, by linking them with a digital wireless link, the signal emission and receipt earth station with the highest aircraft from the multiple aircraft with which it communicates. This feature rationalizes the communication by providing the aircraft that gives the widest coverage. They also participate in the protection against radiation by selecting aircraft that implement the network.

According to another particularly advantageous feature of the invention, the process is remarkable because the signal emission and receipt earth station connects only to the strongest signal through the wireless digital link.

To do this, the antenna of the earth station(s) is equipped with means that enable measuring the power of the signals received. Based on the invention, the antenna connects to the signal having the highest power value.

Based on another particularly beneficial feature of the invention, the process is remarkable since when there are several strong signals, the earth station for emission and receipt of digital signals connects through a wireless link to these multiple signals, but using measurement methods as methods to separate from these signals, which enables identifying:

Different polarizations,
Different frequencies,
Azimut targets to track the sources.

According to another especially advantageous feature of the invention, the equipment for earth receipt consists of a dual antenna:

one upon operation and connected to the strongest signal, one awaiting connection but continuously searching for a strong signal.

The features that enable selecting from available signals in the best conditions enable answering the technical problem related to random aircraft movement.

According to another especially beneficial characteristic of the invention, the data signals are exclusively of internet type.

According to another especially beneficial characteristic of the invention, the data signals are exclusively of television type.

According to another especially beneficial characteristic of the invention, the data signals include telecommunication type signals.

According to another particularly advantageous feature of the invention, the internet and/or television type digital data signal emission and receipt earth station is linked by wire or by digital wireless to one or several internet or television signal access vendors.

In fact, since the aircraft movement (trajectories) in the sky is simply coordinated to avoid collisions, there is an issue of interference during the implementation of the process of the invention:

In partial or total recovery on earth of various radiations received on earth and emitted by the payloads of various aircraft, In interference of radiations between aircraft.

The other elements that constitute a device likely to implement the invention process are, based on a non-restrictive completion method, the following:

one or several internet access vendors, one or several earth stations for the emission and receipt of signals from internet access vendor(s) with the aircraft, connected on one hand to one or several internet access vendors, and on the other hand to one or several antennae for earth-air emission and air-earth receipt of signals, for which earth bases are equipped with one or several aircraft tracking devices and for which the emission or receipt antennae may be of two groups: one group of antennae connected to the flying aircraft and another group of antennae listening and searching for new aircraft to connect, one or several aircraft connected on one hand to one or several earth stations; on the other hand to users on earth equipped with emission and receipt means, for which aircraft could be connected between them to extend the coverage area or cover the complete land surface, One or several satellites (according to another feature of the invention) connected on one hand to one or several earth stations for inter-connection of internet access vendor(s) with satellite(s), on the other hand with one or several aircraft, for which aircraft are in return connected to users on the earth, equipped with means for emission and receipt.

Several users on earth equipped with means for earth-air emission of signals to aircraft and air-earth receipt of signals originating from aircraft.

According to another invention process feature, one or several earth stations are connected through a wireless digital link to one or several satellites for which a satellite is then connected by a wireless digital link to one or several aircraft, for which the aircraft are then connected by wireless digital link to users on earth equipped with means for emission and receipt.

According to another invention process feature, methods for earth-air emission of signals to aircraft and air-earth receipt of signals originating from aircraft that equip the users on the earth, include several antennae for earth-air emission and air-earth receipt of signals and are equipped with one or several aircraft tracking devices and for which the emission or receipt antennae can be of two groups: one group of antennae connected to the aircraft in flight and another group of antennae listening and searching for new aircraft to connect.

According to another feature of the invention, the users on earth can be connected to the earth stations and/or amongst them, instead of directly connecting to aircraft.

The fundamental concepts of the invention have been described above in the most simple format, other details and features shall be clearer upon reading the description that follows and upon examining the appended drawings, that give non-restrictive examples of several network creation methods obtained on the basis of the process compliant with the invention.

BRIEF DESCRIPTION OF THE DRAWINGS

FIG. 7b is a schematic diagram of a sectional view of the antenna in FIG. 7a.

DESCRIPTION OF PREFERRED CREATION METHODS

Figure 1:
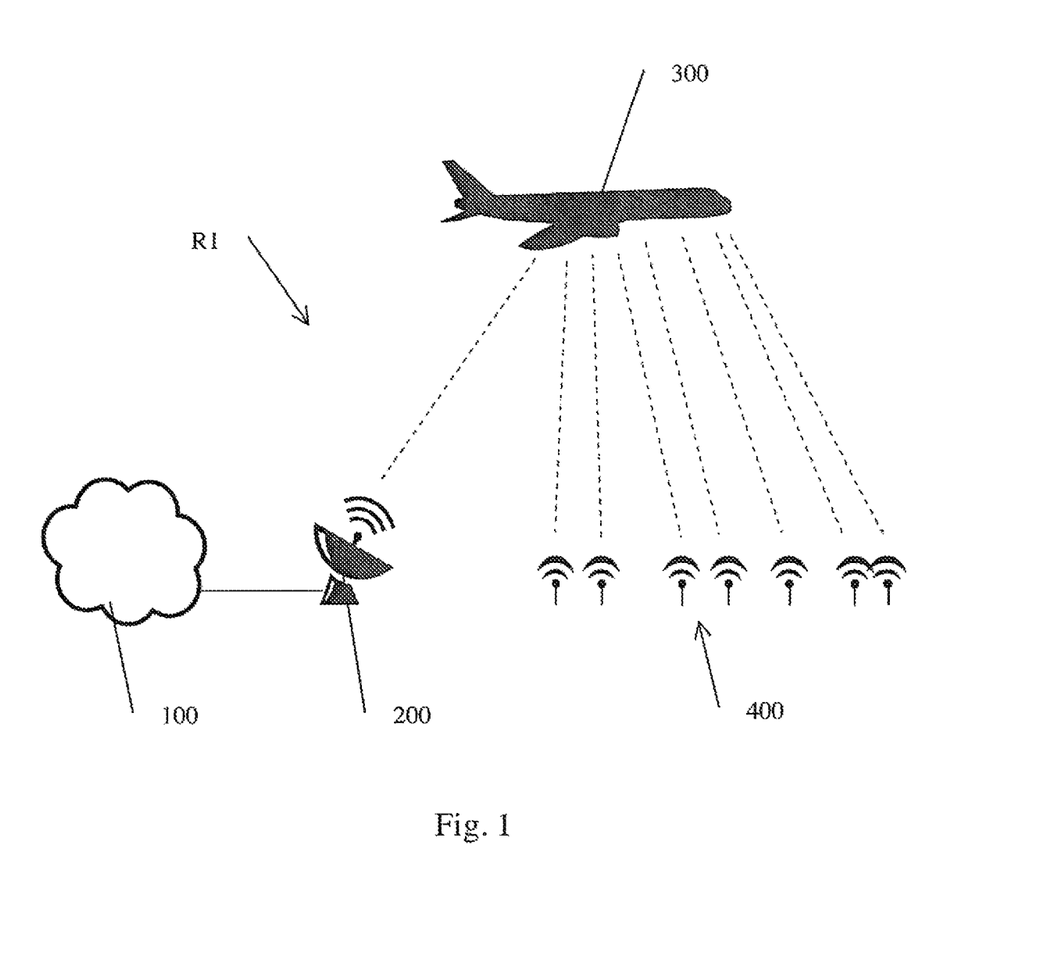
FIG. 1 shows the first creation method consistent with the invention of an internet communication network.

As illustrated in the drawing in FIG. 1, the R1 network includes one or several 100 internet access vendors. This or these internet access vendors are interconnected at one or several 200 earth stations of emission and receipt of internet signals.

These 200 earth stations communicate with a 300 aircraft constellation (only one is illustrated) for transporting passengers, aircraft equipped for this with an internet signal emission and receipt payload. These aircraft can transport from two to over six hundred passengers.

The stations are equipped with several internet signal emission and receipt (earth-air/air-earth) antennae. They are equipped with an aircraft tracking device. These multiple antennae are split into two groups:

one group of antennae connected to the aircraft in flight, and one group of antennae listening to and searching for new aircraft to connect.

Consistent with the invention, the emission power of stations and aircraft payload is modulated on the basis of their altitude. The said payload transported by the 300 aircraft include methods for amplification and polarization of received signals.

In addition to the 200 stations, 400 users on earth equipped themselves with emission and receipt means communicate with the said 300 aircraft and thus have the internet service.

As described above, the 300 aircraft have all the equipment that enables protecting its passengers and equipment from radiation, with:
- At least one layer of absorbent paint for electromagnetic radiation originating from received signals applied to the external surface of the aircraft,
- Acoustic and thermal insulation materials that absorb the electromagnetic radiation applied on the internal surface of the aircraft,
- Internal casing panels of the aircraft made of materials that absorb electromagnetic radiation.
- Windows made of materials that absorb electromagnetic radiation.

Figure 2:
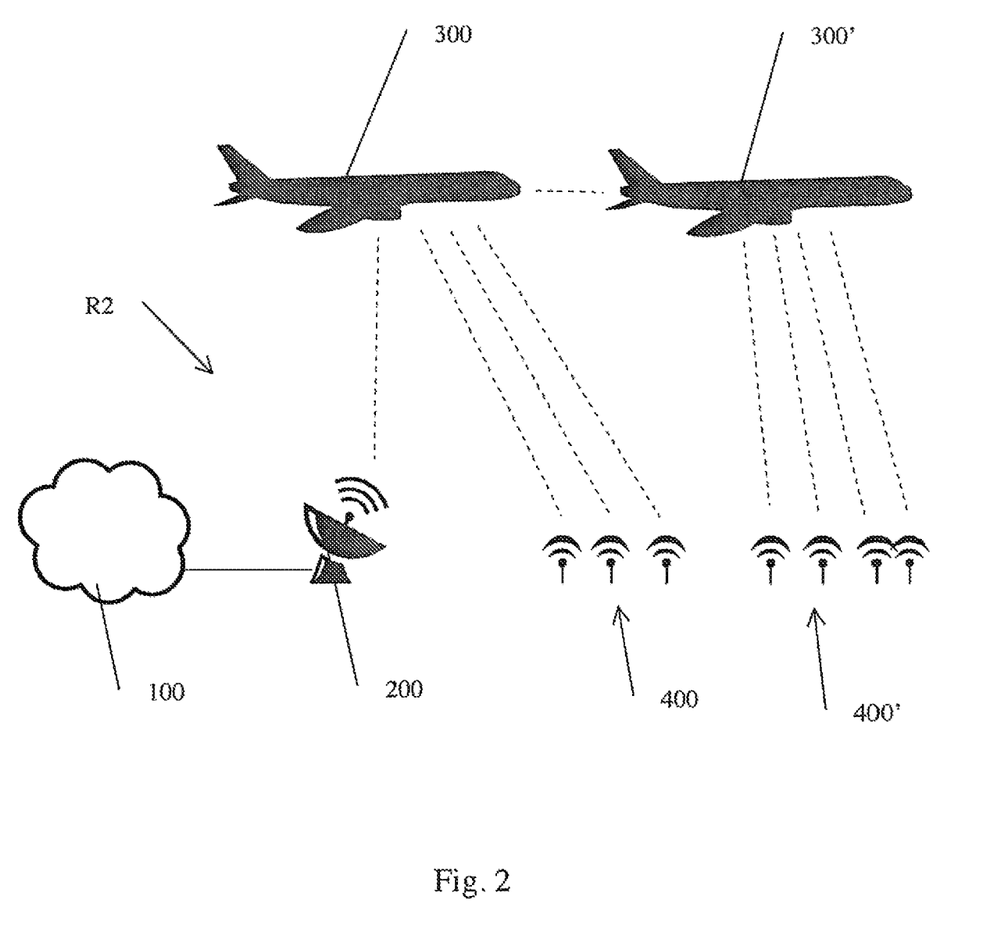
FIG. 2 shows a second creation method consistent with the invention of an internet network.

The creation method for network R2 illustrated by the drawing in FIG. 2 shows the possibility of 300 and 300' aircraft to connect with each other to extend the coverage area and thus cover the land surface completely.

Figure 3:
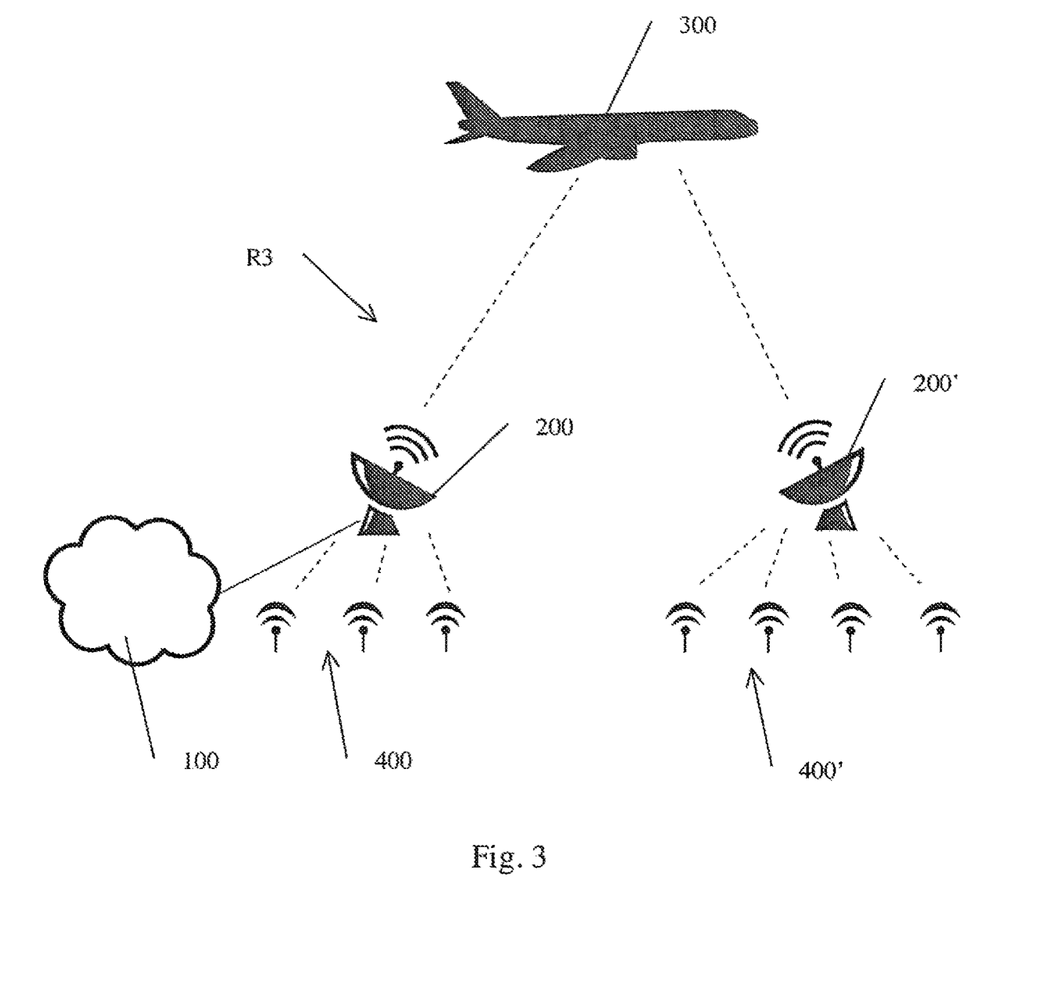
FIG. 3 shows a third creation method consistent with the invention of an internet network.

The creation method of network R3 illustrated by the drawing in FIG. 3 shows that the 400 and 400' users can connect beforehand to the 200 and 200' stations that communicate with both using 300 aircraft to provide internet through a vendor with 100 access available by using a single 200 station.

Figure 4:
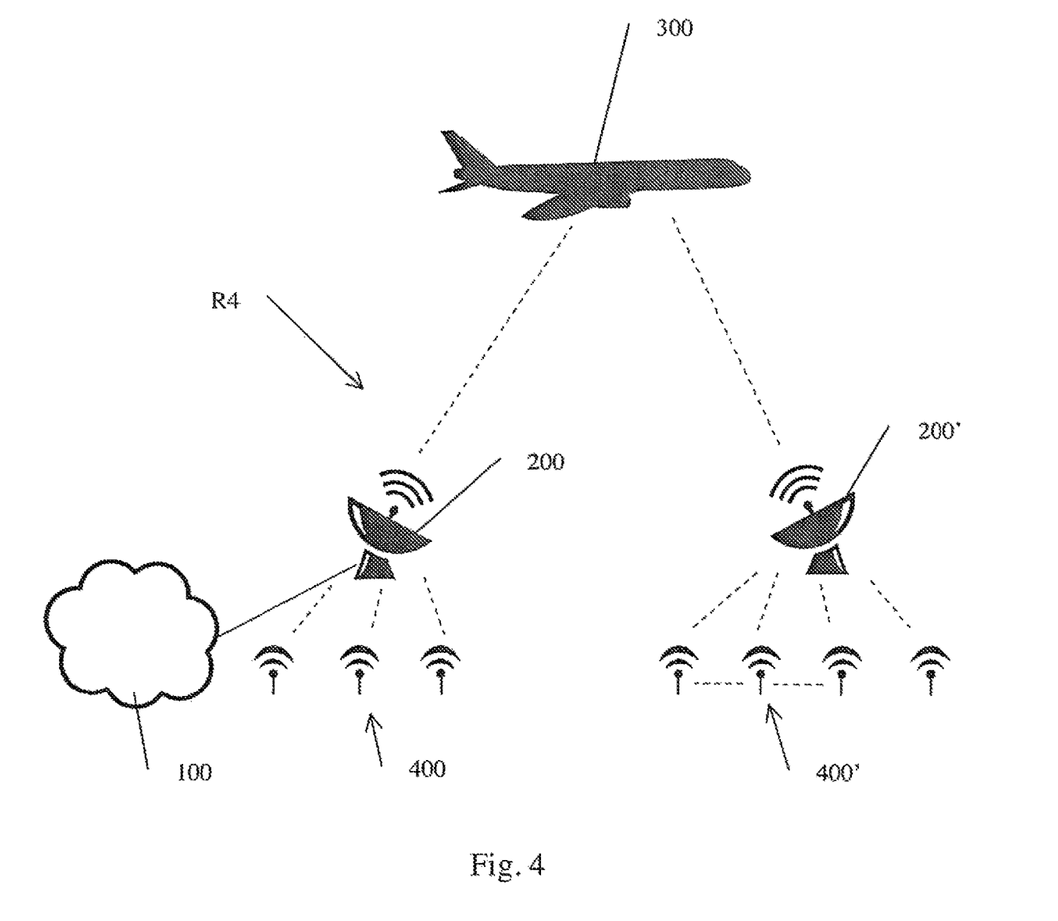
FIG. 4 shows a fourth creation method consistent with the invention of an internet network.

The creation method for network R4 illustrated by the drawing in FIG. 4 shows that the 400' users can communicate with each other before connecting to the 200' station.

Figure 5:
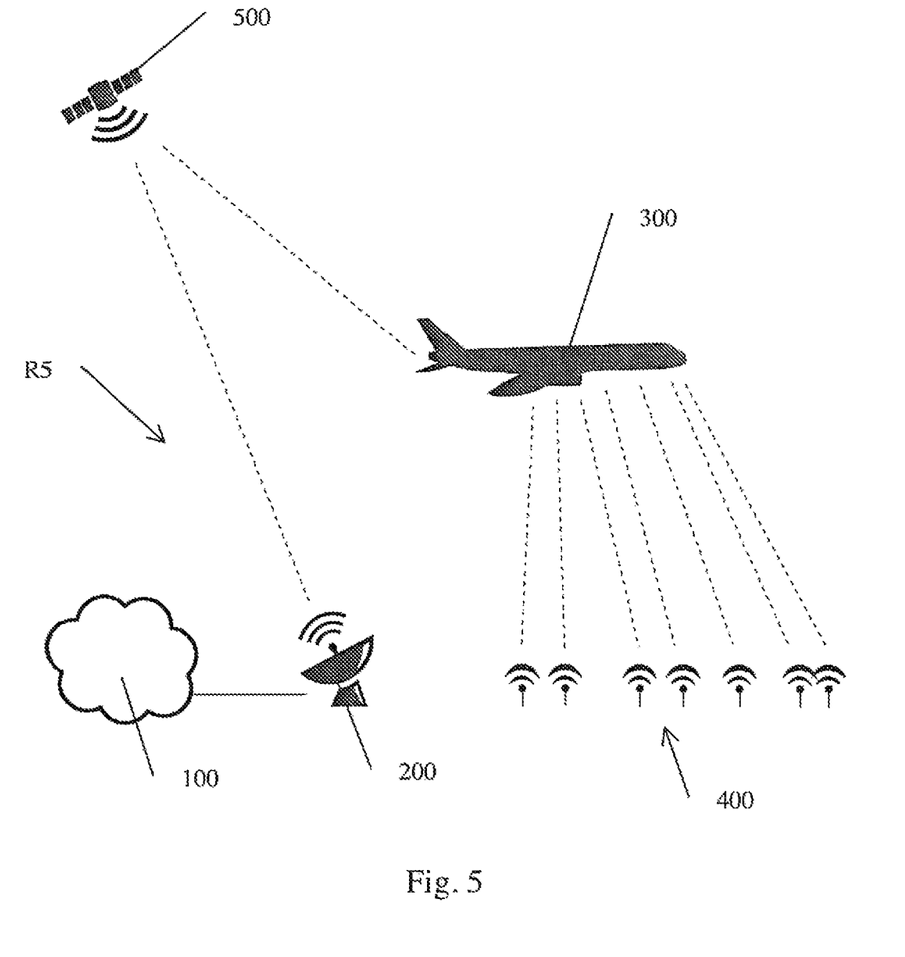
FIG. 5 shows a fifth creation method consistent with the invention of an internet network.

The creation method for network R5 illustrated by the drawing in FIG. 5 integrated the presence of at least one 500 satellite connected with at least one 200 station and with at least one 300 aircraft; the aircraft are in return connected to 400 users on earth.

Figure 6:
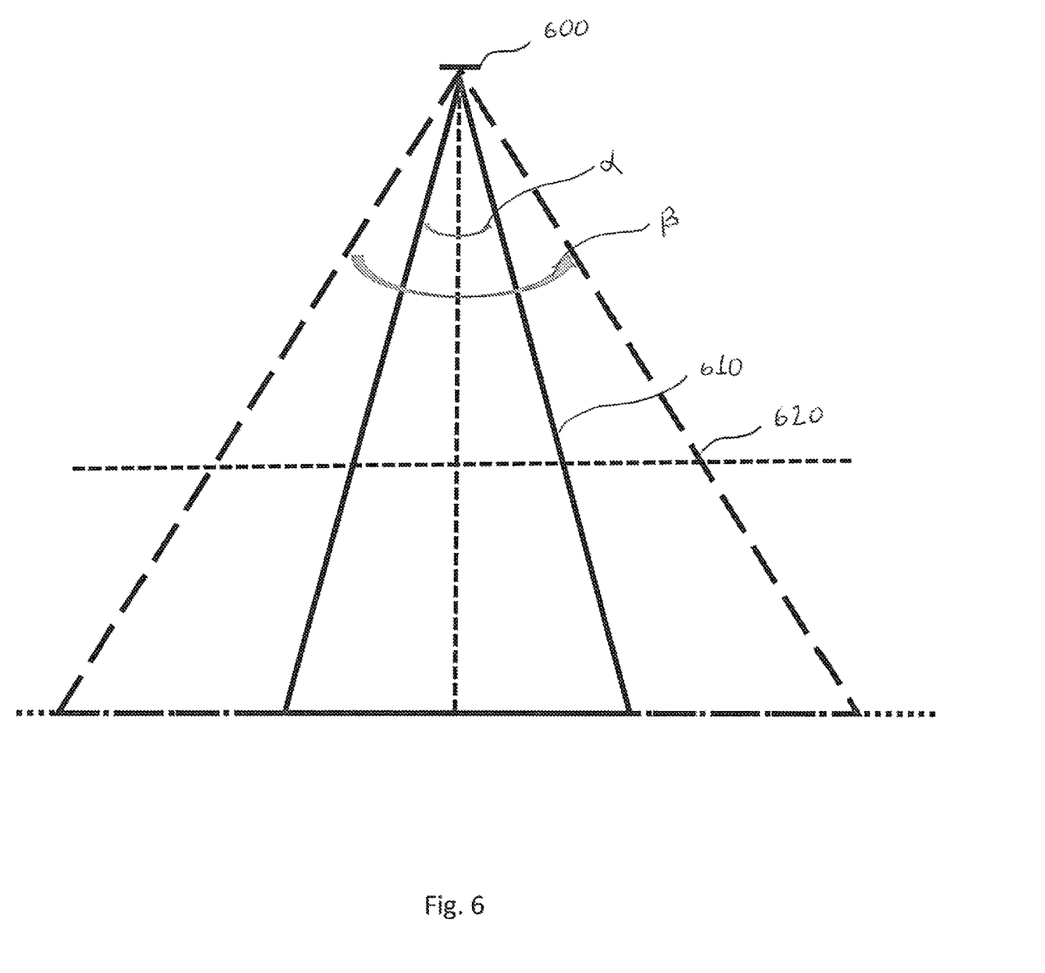
FIG. 6 shows the radiation field on earth of an antenna located at an altitude.

As illustrated in the FIG. 6 drawing, the 600 antenna has a large opening angle. The radiation field of signals emitted by the 600 antenna is divided into two angular sectors that show variations in the power of the radiation received on the earth. The first 610 angular sector drawn as a straight line defined by the alpha angle concerns a sector where the power of the radiation received on the earth is the strongest. A second 620 angular sector larger than the first one drawn in a discontinuous line and defined by the beta angle concerns over and above the alpha angle a portion of the peripheral sector where the power of the radiation received on the ground is less stronger and tougher to use. Therefore, it is known that the power of the radiation received on earth gradually decreases upon moving away from the center of the angular sector of distribution.

It is also understood that the surface concerned by this radiation gradually increases or decreases when the antenna moves away from or approaches the earth.

Figure 7A:
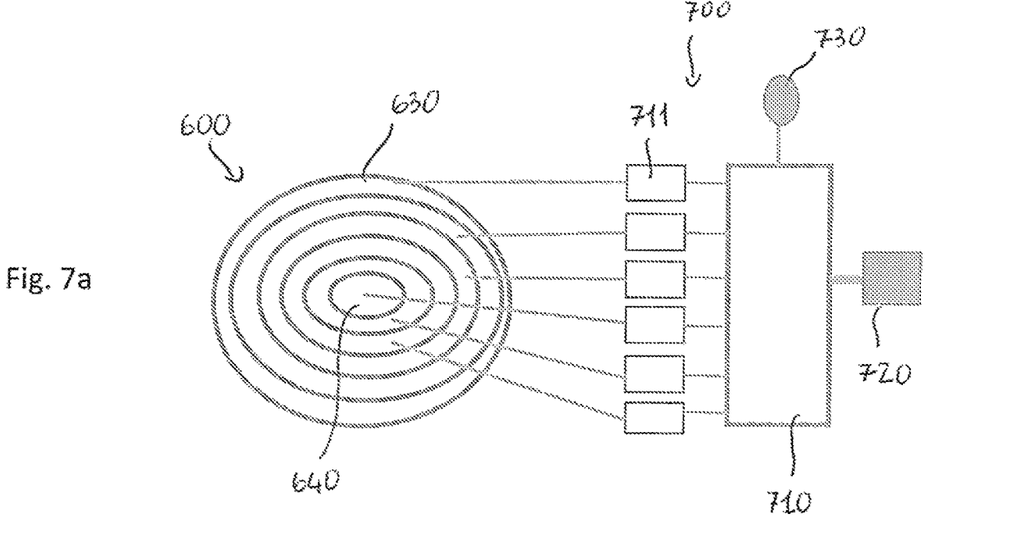
FIG. 7a is a schematic diagram of a frontal view of a creation method of an antenna with a payload consistent with the invention with its command module.

As illustrated in the drawing in FIG. 7a, to mitigate this disadvantage of non-homogeneous radiation power received on the earth, antenna 600 has a specific architecture and is associated with a 700 command module.

This 700 command module includes a 710 power unit or adapter for the 720 general supply from the antenna that can go from zero percent when the aircraft is on the earth to hundred percent when the aircraft has attained its maximum altitude. For this, the 710 power unit is linked to a 730 altitude measurement data receiver.

Thus, every point of the surface on earth radiated by the 600 antenna receives the same power of radiation, irrespective of the aircraft altitude. Additionally, the radiation of the 600 antenna is stopped once the aircraft is on earth.

Figure 7B:
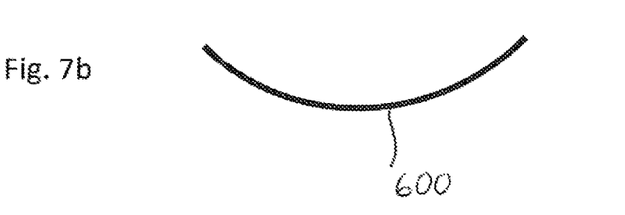

Additionally, the 600 antenna consists of several 630 concentric cells, each one equipped with an individual 711 power unit that enables customizing the power supply of each cell based on the position of each cell with respect to the 640 central cell, such that the value of the individual power supply of each cell increases from the central cell to the peripheral cells so as to get the same transmitted power received on earth irrespective of the position of the digital signal receipt point on the radiated earth surface.

Thus, by using the invented antenna, the power of the radiation received is almost the same, irrespective of whether it is in the 610 central distribution area or in the more peripheral 620.

It is understood that the process and network obtained, the payload and the aircraft, that have been described and shown above, were more of a revelation than a restriction. Of course, miscellaneous arrangements, modifications and improvements can be made to the example above, without having to exit from the scope of the invention.

The invention claimed is:

1. A system for providing internet and/or television type digital data signals across the complete land surface, the system comprising:
   at least one ground station (200) for emission and receipt of internet and/or television type digital data signals;
   at least one aircraft (300) in wireless communication with said at least one ground station (200) for emission and receipt of internet and/or television type digital data signals; and
   at least one user (400) having at least one transmission and receiving means for sending and receiving data signals of internet and/or television;
   wherein said aircraft is equipped with one or more payloads for transmitting and receiving of at least one type of signal to the surface of the Earth, said payload including at least one digital data signal emission antenna (600) consisting of at least one power unit configured to alter power to the antenna from zero percent when said aircraft in on the ground to hundred percent when the aircraft is operating at a maximum altitude such that power of the signal received at the surface of the Earth is the same irrespective of the altitude of the aircraft;
   wherein the maximum altitude of said aircraft is less than or equal to ten kilometers above the Earth.

2. The system of claim 1 wherein said aircraft is an airplane, and wherein the frequency of emission of payloads transported by the airplane is not the same as the navigation equipment of said airplane.

3. The system of claim 1 wherein several aircraft are interconnected through one or more digital wireless link, allowing said interconnected aircraft to communicate by a digital wireless link with said at least one ground station (200) for transmitting and receiving of signals with the highest aircraft (300) among the several aircraft with which they communicate.

4. The system of claim 1, wherein said at least one ground station (200) is not connected via digital wireless link to the strongest signal.

5. The system of claim 1, wherein when there are several strong signals, the ground station (200) for transmitting and receiving of digital signals connects through a wireless link to said multiple signals, and using one or more measurement methods to identify different polarizations, different frequencies, different Azimuth, or combinations thereof, to track the signal sources.

6. The system of claim 1, wherein the equipment for receipt on earth from the ground station (200) for transmitting and receiving of signals, comprises a dual antenna wherein one antenna is connected to the strongest signal, and one antenna is awaiting connection but continuously searching for a strong signal.

7. The system of claim 1, wherein the ground station (200) for emission and/or receipt of internet and/or television type digital data is linked by wire or by digital wireless to one or several internet access (100) or television signal vendors.

8. The system of claim 1, wherein one or several ground stations are connected through a wireless digital link to one or several satellites for which a satellite is then connected by a wireless digital link to one or several aircraft, for which the aircraft are then connected by wireless digital link to at least one user (400).

9. The system of claim 1, wherein the methods for earth-air emission of signals to aircraft and air-earth receipt of signals originating from aircraft that equip the users on the earth, include several antennae for earth-air emission and air-earth receipt of signals and are equipped with one or several aircraft tracking devices and for which the emission or receipt antennae can be of two groups: one group of antennae connected to the aircraft in flight and another group of antennae listening and searching for new aircraft to connect.

10. A passenger and/or freight transport aircraft (300) for use in the system of claim 1 wherein said aircraft (300) transports passengers and/or freight of over five hundred kilograms, and is equipped with at least one payload powered by the energy of the aircraft meant for the transmission and receipt of signals, and with several additional antennae other than those required for the navigation of an aircraft (300); and
wherein said antenna are painted or printed on the fuselage and/or the wings of the aircraft and/or vertical fins, are "Patch" type planar antennae that cover all or part of the fuselage, and/or wings, and/or vertical fins of the aircraft (300), or combinations thereof.

11. The passenger and/or freight transport aircraft of claim 10, wherein at least one layer of absorbent paint for electromagnetic radiation originating from signals is applied to the external surface of the aircraft (300).

12. The passenger and/or freight transport aircraft of claim 10, wherein acoustic and thermal insulation materials that absorb electromagnetic radiation are applied to the internal surface of the aircraft (300).

13. The passenger and/or freight transport aircraft of claim 10, wherein the aircraft's internal casing panels are made of materials that absorb electromagnetic radiation.

14. The passenger and/or freight transport aircraft of claim 10, wherein the aircraft's windows are made of materials that absorb electromagnetic radiation.

15. The passenger and/or freight transport aircraft of claim 10, wherein said aircraft (300) transports from two to one thousand passengers.

16. The passenger and/or freight transport aircraft of claim 10, wherein said aircraft (300) transports from fifty to one thousand passengers.

17. The system of claim 1 wherein said payload includes one or more digital data signal emission antennae to the global land surface.

18. The system of claim 17 wherein said antenna has a large opening angle that attains 180 degrees that enables it to cover a very large surface with radiation on earth that can attain seven hundred thousand square kilometers.

19. The system of claim 17 wherein the angle of opening is variable based on the altitude thanks to a method for opening angle variation that the antenna is equipped with.

20. The system of claim 17 wherein the opening angle variation method is linked to altitude measurement sensors that are provided in the aircraft and/or payload.

21. The system of claim 17 wherein the variation in the opening angle occurs in an upward direction when the altitude decreases so as to enable the antenna to have the same radiated surface on earth, irrespective of the altitude the aircraft is at.

22. The system of claim 17 wherein the maximum opening angle is 180 degrees.

23. The system of claim 17 wherein the maximum value of the opening angle is between 90 and 180 degrees.

24. The system of claim 17 wherein the antenna (600) consists of a power unit for general power supply to the antenna from zero percent (on earth) to hundred percent (maximum altitude) of the maximum supply power (power at maximum altitude), in such a way that each point of the earth surface radiated by the antenna receives the same power of radiation, irrespective of the altitude of the aircraft and so as to switch off the radiation from the antenna once the aircraft touches down.

25. The system of claim 17 wherein the antenna (600) consists of several concentric cells (630), each one equipped with an individual power unit (711) that enables customizing the power supply of each cell based on the position of each cell (630) with respect to the central cell (640), such that the value of the individual power supply of each cell (630) increases from the central cell (640) to the peripheral cells so as to get the same radiation power received on earth irrespective of the position of the digital signal receipt point on the covered earth surface.

26. The system of claim 17 wherein maximum power supply is 500 Kilowatts.

27. The system of claim 17 wherein the maximum value of the power supply is between 2 and 500 Kilowatts.

28. The system of claim 17 wherein its maximum power supply is between 23 and 500 Kilowatts.

29. The system of claim 17 wherein the maximum value of the payload power supply is between 30 and 500 Kilowatts.

* * * * *